United States Patent [19]

Gutierrez et al.

[11] 4,273,596
[45] Jun. 16, 1981

[54] METHOD OF PREPARING A MONOLITHIC INTRINSIC INFRARED FOCAL PLANE CHARGE COUPLED DEVICE IMAGER

[75] Inventors: William A. Gutierrez, Woodbridge; John H. Pollard, Alexandria, both of Va.

[73] Assignee: The United States of America as represented by the Secretary of the Army, Washington, D.C.

[21] Appl. No.: 109,025

[22] Filed: Jan. 2, 1980

Related U.S. Application Data

[62] Division of Ser. No. 948,129, Oct. 3, 1978, Pat. No. 4,228,365.

[51] Int. Cl.³ .................. H01L 21/368; H01L 21/82; H01L 27/14
[52] U.S. Cl. .................... 148/171; 29/571; 29/572; 148/172; 148/175; 307/221 D; 357/15; 357/16; 357/24; 357/30; 357/61
[58] Field of Search .............................. 148/171–173, 148/175; 29/572, 571, 576 E; 357/24, 30, 61, 15, 16; 307/221 D

[56] References Cited

U.S. PATENT DOCUMENTS

| | | | |
|---|---|---|---|
| 3,510,715 | 5/1970 | Lehmann | 357/16 X |
| 3,699,401 | 10/1972 | Tietjen et al. | 357/30 |
| 3,718,511 | 2/1973 | Moulin | 148/171 |
| 3,882,531 | 5/1975 | Michon et al. | 357/24 |
| 3,902,066 | 8/1975 | Roosild et al. | 357/24 X |
| 3,902,924 | 9/1975 | Maciolek et al. | 148/171 X |
| 4,021,836 | 5/1977 | Andrews et al. | 357/30 |
| 4,028,719 | 6/1977 | Curtis | 357/30 |
| 4,032,952 | 6/1977 | Ohba et al. | 357/24 |
| 4,142,198 | 2/1979 | Finnila et al. | 357/24 |

FOREIGN PATENT DOCUMENTS

| | | | |
|---|---|---|---|
| 2712479 | 10/1977 | Fed. Rep. of Germany | 357/24 |
| 48-12684 | 2/1973 | Japan | 357/24 |
| 1532859 | 11/1978 | United Kingdom | 357/24 |

Primary Examiner—L. Dewayne Rutledge
Assistant Examiner—W. G. Saba
Attorney, Agent, or Firm—Nathan Edelberg; Milton W. Lee; Max L. Harwell

[57] ABSTRACT

An infrared (IR) detector device comprised of a solid state, radiation hard, and high resolution monolithic IR focal plane array for imaging applications. The monolithic IR focal plane array has a heterostructure injection scheme that prevents charged-coupled device (CCD) "well filling" by using a heterojunction barrier between the absorber, or detector layer, and the transfer layer. Injection of signal charge into a CCD multiplexer is controlled by establishing a punch through condition between the absorber layer and the CCD channel. The detector layer and the CCD multiplexer are on different planes of the focal plane array.

4 Claims, 9 Drawing Figures

METHOD OF PREPARING A MONOLITHIC INTRINSIC INFRARED FOCAL PLANE CHARGE COUPLED DEVICE IMAGER

The invention described herein may be manufactured, used, and licensed by the U.S. Government for governmental purposes without the payment of any royalties thereon.

This is a division of application Ser. No. 948,129, filed Oct. 3, 1978, now U.S. Pat. No. 4,228,365.

BACKGROUND OF THE INVENTION

There are currently two schemes for structuring an infrared focal plane array, namely the monolithic and the hybrid approaches. The monolithics are being developed both as extrinsics, where well established silicon batch processing technology can be exploited, and as intrinsics in the Groups III-V, II-VI, and IV-VI trimetal alloys. The incentives for developing monolithic intrinsic arrays in these trimetal alloy systems are the well-known advantages of high operating temperature, low cross talk, and high quantum efficiency. The hybrid approach couples two independent and relatively mature technologies; namely, intrinsic alloy photovoltaic arrays and silicon CCD multiplexers. Advantages of this approach include the ability to independently select and optimize the detector and readout media. The benefits however must be considered in light of the very difficult requirement for an advanced high yield physical and electrical interconnect technology which severely limits the detector density and device reliability, which is caused by the nature of the detector/multiplexer interface.

An ideal focal plane array, which includes sensor (dectector) signal processor, multiplexer, and interface electronics, would be a monolithic intrinsic structure capable of being tuned for operation over the spectral region of interest, i.e. 0.8-14 microns, and whose construction is simple and compatible with large scale integration techniques. It is also desirable that the array be radiation hard, unscanned, and capable of being operated at higher practical temperatures than is needed for extrinsic silicon. The present invention comprises the concept, operation, and method of fabrication of such a focal plane array.

SUMMARY OF THE INVENTION

The present focal plane array is comprised of a substrate layer having four epitaxial grown layers of the same material on one side therof with the last layer, an oppositely doped n-channel layer, being interfaced with Schottky barrier contact gates connected to a CCD layer. A metal ohmic contact is present on the input side of the substrate. An optical filter may be positioned between the metal ohmic contact and the substrate to filter out any unwanted spectral frequency. Even though it is not anticipated as limited thereto, Cadmium-mercurytelluride (CDHgTe) material may be used in the four epitaxial grown layers since that combination provides lattice matching for efficient injection across the p-doped heterojunction between an absorber layer and a transfer layer wherein the transfer layer is contiguous with said n-doped channel layer and the absorber layer is contiguous with the transfer layer. A p-doped spillover layer between the substrate and the absorber layer has a proper bandgap and thickness to hold excess electrons and prevent spillover of the detector signal in the absorber layer into the CCD channels.

Detection of an incoming IR signal occurs in the absorber layer, which is comprised of low bandgap CdHgTe layer and charge handling is accomplished in the channel layer, which may be a wide bandgap CdHgTe layer, or a CdTe layer. The absorber layer may be a CdHgTe composition layer that is adjusted to spectrally tune the device for operation in any spectral region from 0.8 to 14 microns and beyond, including the 1-2 micron, 3-5 micron, and 8-14 micron atmospheric windows. The high resolution capability of the present monolithic intrinsic IR focal plane CCD imager is achieved by selected gate field phasing by use of four phase switching of Schottky barrier gates. The imager provides a simple monolithic approach, i.e. no interface technology required.

Some of the advantages of the present imager are as follows:

(1) Simple fabrication compatible with LSI technology, thus having low cost potential, and may be constructed in unscanned two dimensional focal plane array;

(2) A radiation hardened device;

(3) Automatic antiblooming feature for Schottky barrier gate embodiments;

(4) High resolution, defined by gate structure and field, and is not reliant on thermal diffusion length;

(5) Low noise injection scheme, i.e. background limited performance (BLIP) operation;

(6) Detection is in a narrow bandgap absorber material, while charge handling is in wide bandgap charge transfer device material which leads to high charge storage capacity, high avalanche breakdown fields, low thermal generation rate, and negligible tunnel current effects;

(7) Spectrally tunable over the entire wavelengths of interest, i.e. 0.8-14 microns and beyond; and (8) Heterojunction injection scheme prevents CCD "well-filling" and is low noise in a lattice matched system.

Some of the novel features of the present monolithic IR focal plane CCD imager are as follows:

(1) Injection scheme by use of punch through condition—a true direct injection scheme. The P-P heterojunction between absorber and transfer layers prevents CCD "well-filling" and allows signal time sampling, therefore, solving the detector/multiplexer interface problem;

(2) High resolution definition of absorber detector area by field penetration during charge injection intergration period;

(3) Compatibility of device design with LSI technology;

(4) Versatile detector tuning by choice of lattice matched material composition of the absorber;

(5) Direct monolithic mating of absorber detector and CCD in one uniform continuous structure resulting in ease of fabrication and in high reliability;

(6) Injection does not require source or gate injection since it is a heterostructure injection scheme operating in the charge domain;

(7) Injection scheme does not suffer as prior art devices do from incompatibility between photovoltaic detector operating point and MOS threshold voltage, thus allowing reliable high density structures with greater response uniformity;

(8) No A.C. technique required in injection scheme;

(9) Limited "non-CCD well" filling during the off period is controlled by choice of the first layer, or spillover layer, bandgap and thickness, thus preventing spillover into the CCD channel;

(10) Detector layer and CCD layer are on different planes, thus minimizing usage of chip real estate resulting in high density detectors; and (11) Potential use of an imaging CCD in a pluse gated system.

DETAILED DESCRIPTION OF THE PREFERRED EMBODIMENT

Figure 1:
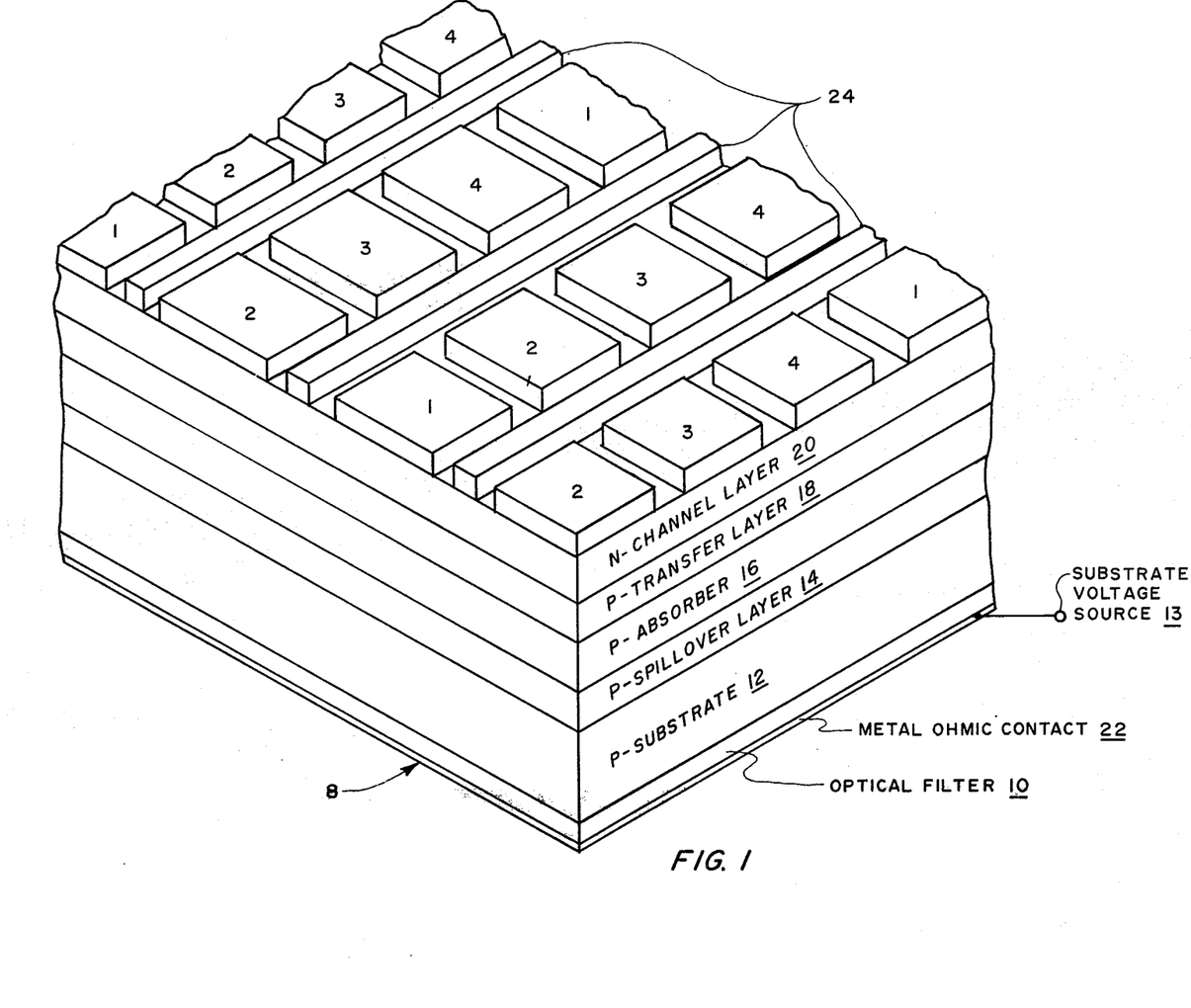
FIG. 1 illustrates the monolithic IR focal plane with the various layers.

The present monolithic intrinsic IR focal plane CCD imager, which has the capability of being tuned for operation over the spectral region from 0.8 micron to 14 microns and beyond, of possibly up to 300 microns, will be better understood with reference to the Figures. FIG. 1 shows the architecture of the monolithic focal plane device 8 with the various layers and their functions indicated. The device 8 is four phase operated with the various phase connections labeled as 1, 2, 3, and 4 on metal Schottky barrier gates. Device 8 is further explained herein below with reference to FIGS. 2A, 2B, 2C, 3, 4, and 5, with reference voltage waves of the CCD processor included in FIGS. 6 and 7. The present monolithic IR focal plane CCD imager 8 is a non-scanning type device, i.e. it does not depend on the incoming signal radiation and background noise being scanned across the external IR detectors to properly process the scene image. Rather, the incoming signal radiation and background noise is collected in an internal absorber layer 16 whereupon the photon wave energy is converted to electron charge. The imager 8 does not have distinct detectors, but has a plurality of areas defined by the low bandgap absorber layer 16 that exists under the activated Schottky barrier gates. If there is overflow of electrons in the absorber layer 16, the electrons will overflow into the spillover layer 14. In the operational condition, the electrons momentarily reside in and recombine in the absorber layer 16 and possibly in the spillover layer 14 if layer 16 overfills. Therefore, the "well" that is formed between the substrate 12 and the transfer layer 18 will not overfill and spill into the CCD channel 20 because the thickness and bandgap of the spillover layer 14 provides a large enough charge handling capability to handle any extra charge from the absorber layer. Hence, the generated electron charges are retained in the well that is formed by both the absorber and spillover layers until the electron charges are "punched down" into the CCD channel layer 20. Lattice matching at the P—P heterojunction between the absorber layer 16 and the transfer layer 18 is important for efficient injection across the P—P heterojunction.

Figure 3:
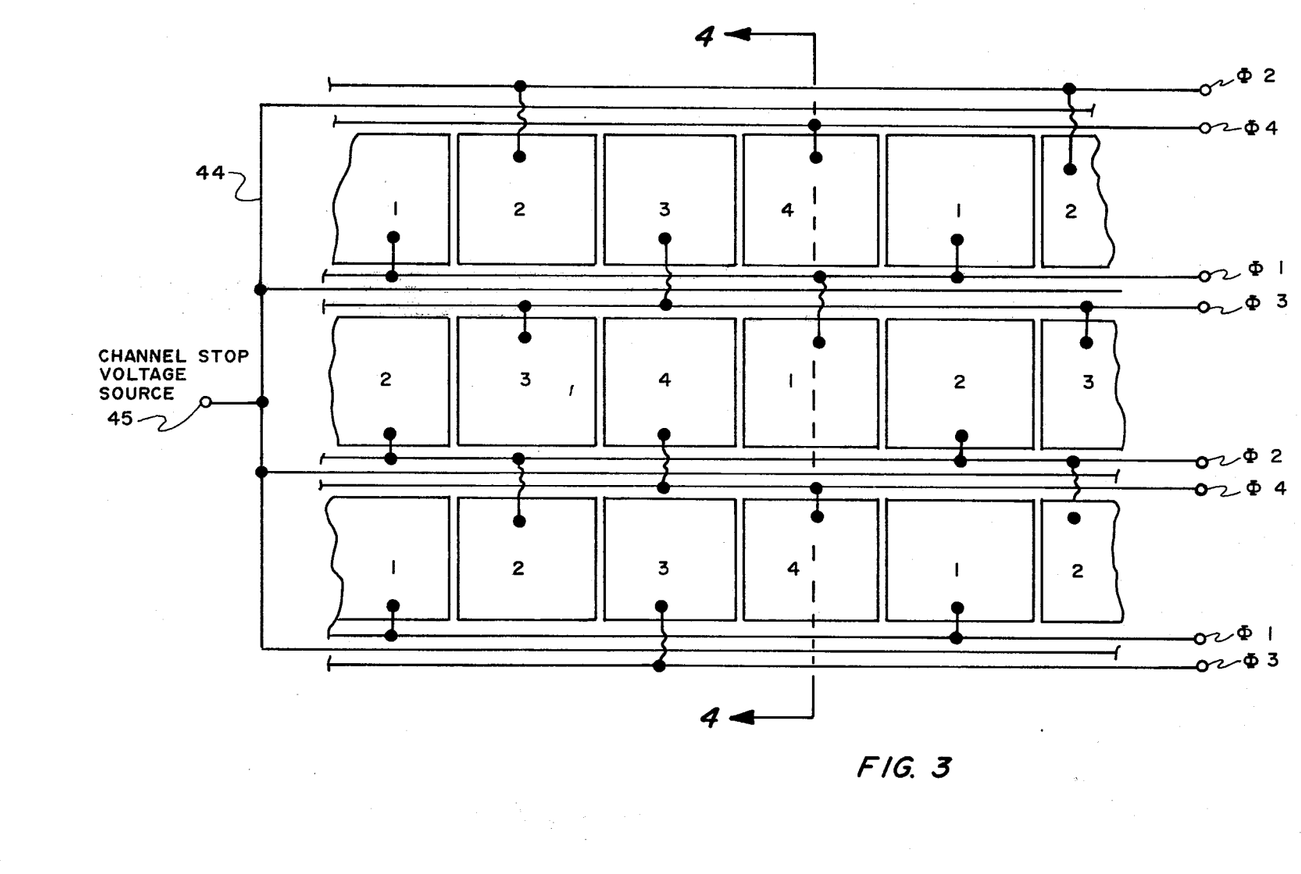
FIG. 3 illustrates a schematic of interconnections for the Schottky barrier gates of a four phase CCD processor used with the focal plane.
Figure 4:
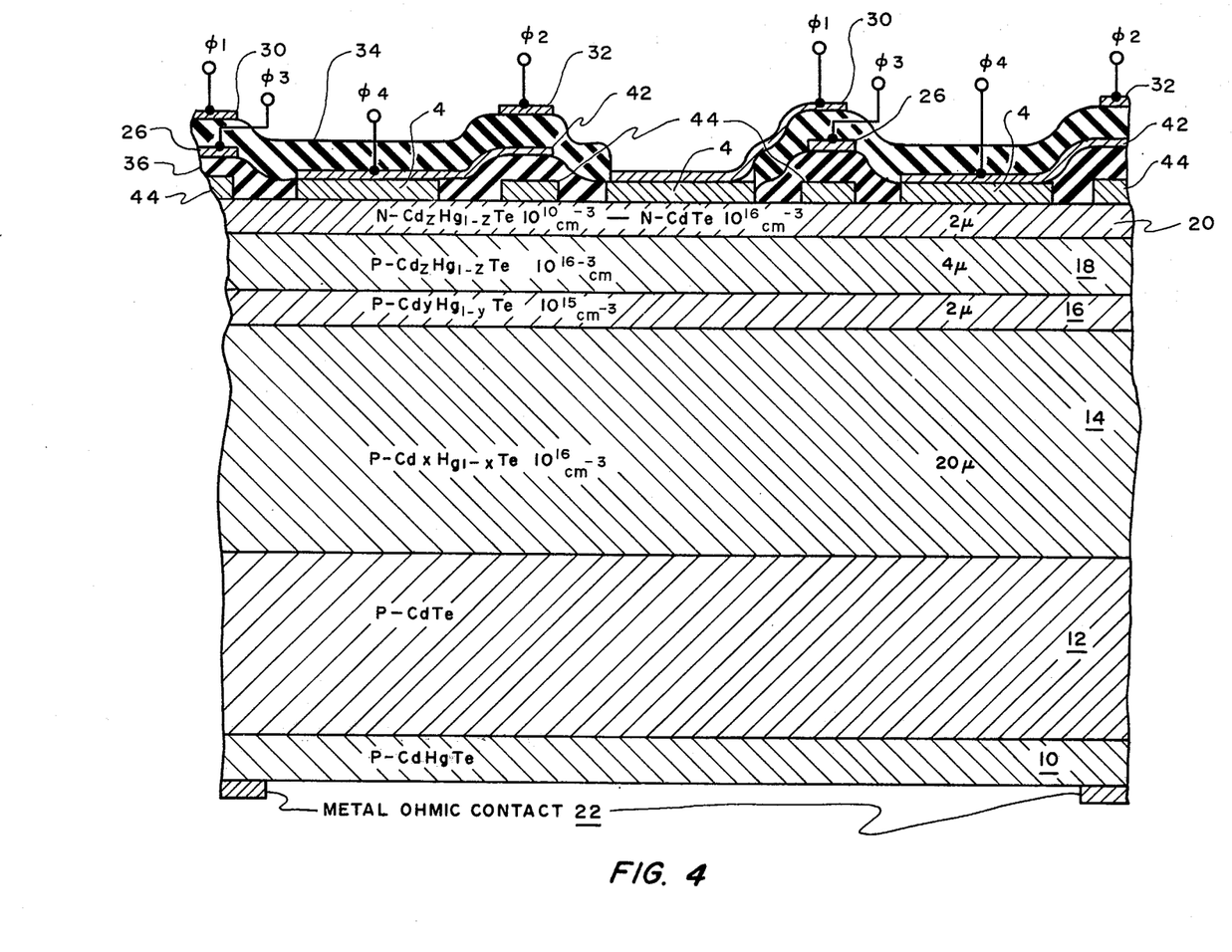
FIG. 4 is a sectional view on the line 4—4 of FIG. 3 that shows the doping concentrations and thicknesses of the focal plane layers.
Figure 5:
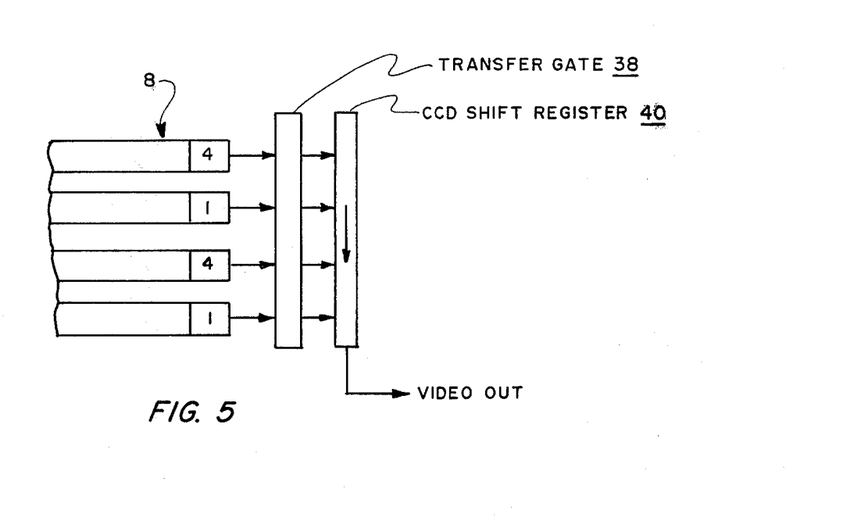
FIG. 5 shows a plan view of a parallel sweep of charges by the Schottky barrier gate with the transfer gate interfaced with the input to a CCD shift register.
Figure 6:
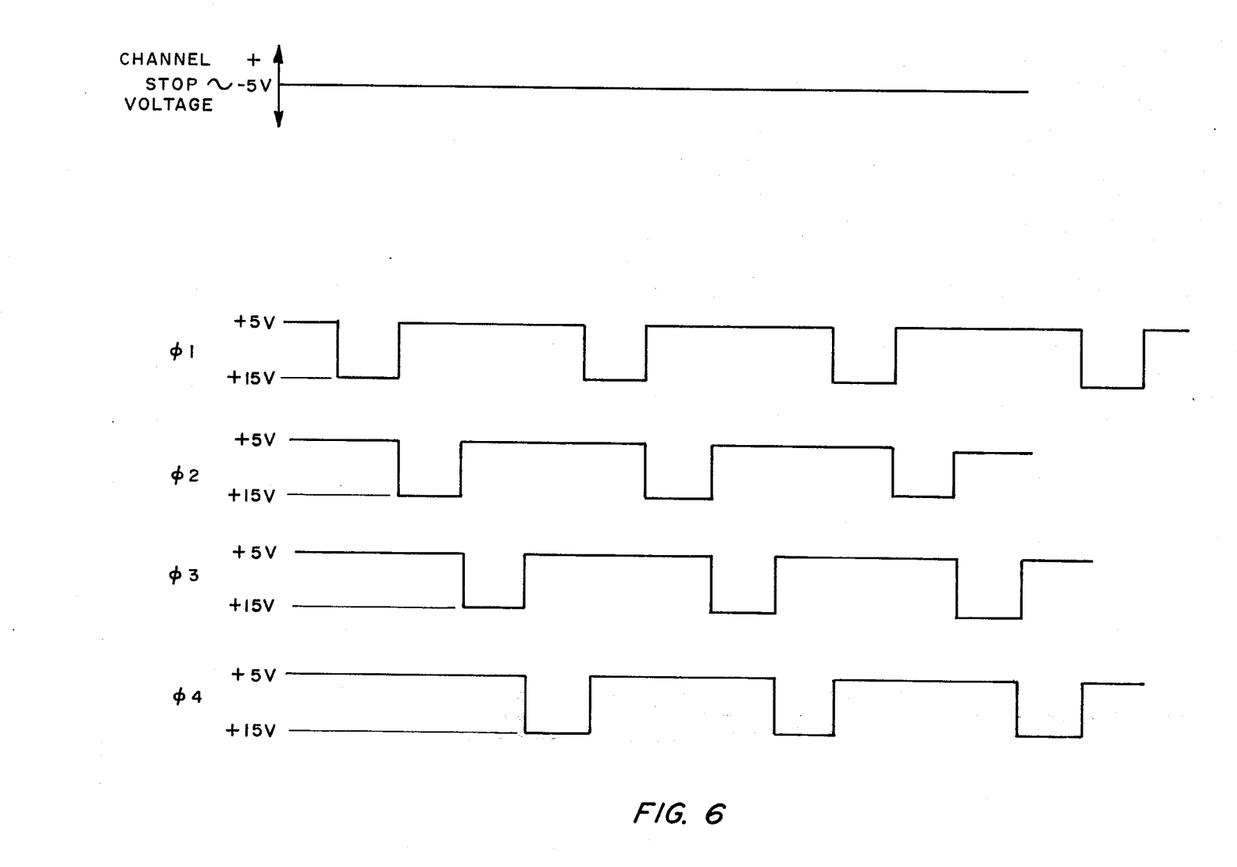
FIG. 6 illustrates the switching voltages applied along a line of the Schottky barrier gate and representative channel stop voltage.
Figure 7:
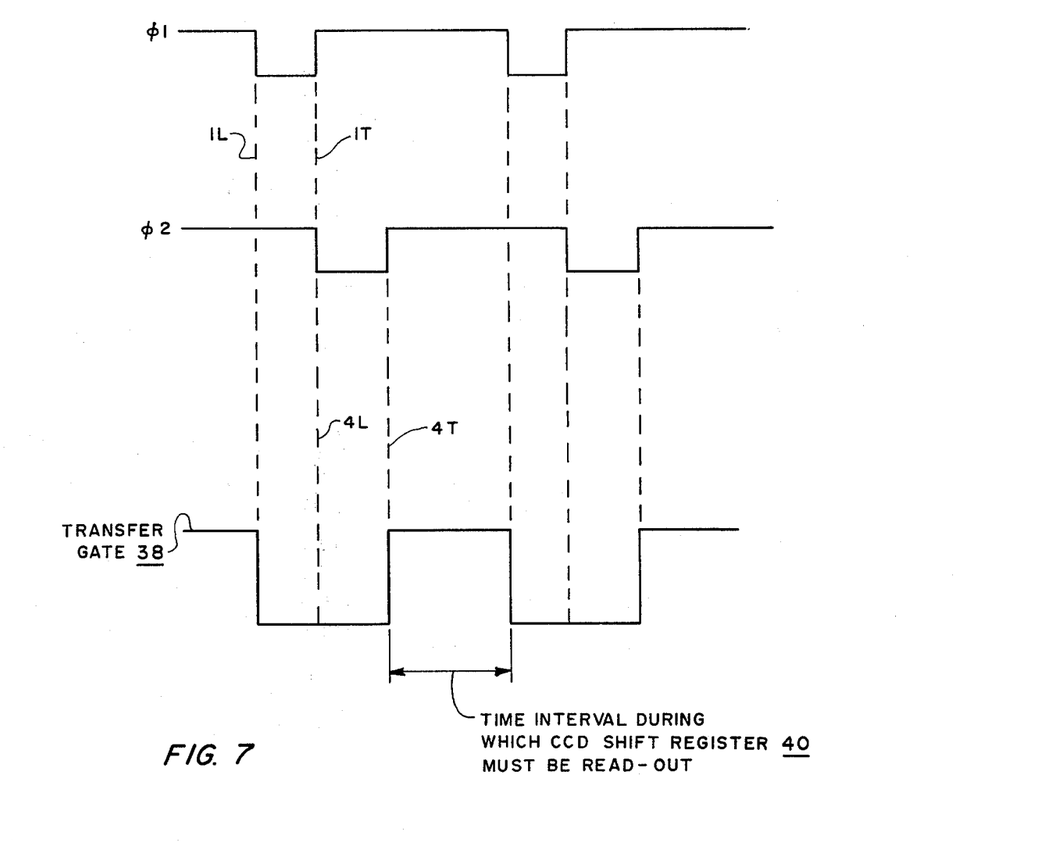
FIG. 7 illustrates the voltages of the two output channels as shown in FIG. 5 and the transfer gate that alternately switches these adjacent phased outputs.

FIGS. 3, 4, 5, 6 and 7 may now be referred to for a better understanding of imager 8. The thickness of the various layers are preferably the thicknesses as indicated in FIG. 4. The preferred mode of switching the four phases, indicated as $\phi 1$, $\phi 2$, $\phi 3$ and $\phi 4$, of the Schottky barrier gates 1, 2, 3, and 4 is to switch "on" all of the $\phi 1$ and $\phi 3$ at exactly the same time and alternately switch "on" all of the $\phi 2$ and $\phi 4$ at exactly the same time for the next frame. Looking at FIGS. 3, 4, and 5, it can be seen that any of the odd numbered Schottky barrier gates, i.e. gates 1 or 3, are surrounded on all four sides by only even numbered Schottky barrier gates, i.e. gates 2 or 4. Likewise, any of the even numbered Schottky barrier gates are surrounded on all four sides by only odd numbered Schottky barrier gates. Channel stops 44 electrically isolate each row of the Schottky barrier gates to prevent cross-talk or blooming into adjacent rows. Channel stops 44 are held at a negative potential for electrical isolation. An assumption is made with respect to discussion of device 8 that the last of the Schottky gates on alternate rows are 1 and 4 as indicated by Figures 5 and 7. Therefore, the transfer gate 38 receives alternate electron charges from wells developed under Schottky gates 1 and 4 and parallel outputs the same alternate electron charges to a serial CCD shift register 40 for producing a serial video output. The serial video output may be used for either direct or remote viewing. In this manner of processing the video signal there is no need for a storage shift register, or in other words a memory is not needed.

CONSTRUCTION OF MONOLITHIC FOCAL PLANE

The focal plane device 8 may be constructed as follows. A p-type, low resistivity combination of Group II-VI elements, such as Cadmium Telluride (CdTe) or Cadmium Selenium (CdSe) single crystal wafer is used as the window substrate layer 12. The preferred combination is CdTe, but Se may be substituted for Te throughout this specification. From here on Te will however be the referenced element. The p-type CdTe single crystal wafer is used to seed the epitaxial growth of a p-doped $Cd_xHg_{1-x}Te$, $1 \times 10^{16}$ cm$^{-3}$, 20 micron spillover layer 14. The p-doped $Cd_yHg_{1-y}Te$, $1 \times 10^{15}$ cm$^{-3}$, 2 micron absorber layer 16 is then epitaxially grown on the spillover layer 14. Next, the p-doped $Cd_zHg_{1-z}Te$, $1 \times 10^{16}$ cm$^{-3}$, 4 micron transfer layer 18 is epitaxially grown on the absorber layer 16. Next, an n-doped $Cd_zHg_{1-z}Te$, $1 \times 10^{16}$ cm$^{-3}$, 2 micron channel layer 20 is epitaxially grown on the transfer layer 18. It should be noted that layers 18 and 20 do not necessarily have to be of the same composition as represented by subscript z. All four of these layers are preferably grown by liquid phase epitaxy at about 300° C. to 500° C. at a growth rate of about ½ micron per minute however other techniques of growth may be used. The CCD gate structure is next formed on the channel layer 20 surface. Schottky barrier gate technology is preferred for the CCD gate structure because it is radiation hard and is not subject to the stringent interfacial properties required of a metal-insulator-semiconductor (MIS) gate technology. However, should a MIS technology become viable for $Cd_zHg_{1-z}Te$, the MIS technology may also be considered for the CCD gate structure. The CCD gate structure is explained more fully herein below. In the above x, y, and z substripts z is never greater than 1 and is preferably about 0.9. Subscript x is about 0.4. Subscript y is about 0.2.

Deposited on the opposite side of substrate 12 from the four epitaxially grown layers 14, 16, 18, and 20 is an optical window, or optical filter 10, preferably made of p-doped CdHgTe that covers the input surface of the substrate 12. A metal ohmic contact 22 of some configuration is deposited on a portion of optical filter 10 for electrical contact to the image system. The metal ohmic contact 22 may be only around the extreme outer edges of the optical filter 10 and is preferably made of some alloy of the Group V material. The optical filter 10 defines the short wavelength cutoff of the image device 8. As an example, if the absorber layer 16 has a composition to detect the 8-14 micron image, the optical filter will absorb light of all wavelengths less than 8 microns.

The Schottky barrier CCD gate structure that is formed on the channel layer 20 surface is preferably comprised of the following layers that are shown distinctly in FIGS. 1, 3 and 4. FIG. 4 is a sectional view taken from line 4—4 of FIG. 3. The Schottky gates 1, 2, 3, and 4 and the channel stops 44 that separate each row of Schottky barrier gates are first deposited on channel layer 20. A first insulator layer 36 is deposited between the channel stops 44 and the gates 1, 2, 3, and 4. A first metallization step is used to deposit first and second metal layers 26 and 42 over first insulator layer 36 and Schottky gates 4 as shown in FIG. 4. Second metal layer 42 is in electrical contact with Schottky gate 4 and has the fourth phase voltage source, indicated by $\phi 4$, of the four phase CCD switching system attached thereto. First metal 26 is likewise in electrical contact with Schottky gate 3 (even though not able to show in FIG. 4) and has the third phase voltage source, indicated by $\phi 3$, attached thereto. A second insulator layer 34 is now deposited over the remaining bare first insulator layer 36, and first and second metal layers 26 and 42. A second metallization step is used to deposit third and fourth metal layers 30 and 32 that are respectively in electrical contact with Schottky gate 1 and Schottky gate 2 (not shown in FIG. 4) and have the first and second phased voltage source, represented by $\phi 1$ and $\phi 2$, attached thereto. The first and second insulator layers 36 and 34 are preferably made of SiOx doped with nitrogen. The Schottky gates and metal layers may be made of any metal with a high work function, such as aluminum or gold. The various interlaced channel stops 44 are connected to a channel stop voltage source at terminal 45. The substrate layer 12 is connected to a substrate voltage source 13 at the metal ohmic contact 22. A suitable growth technique for the CdHgTe layers is liquid phase epitaxy although any technique or combination of techniques that may prove capable of growing CdHgTe multilayers of appropriate compositions may be used. The channel stops and the Schottky gates may be grown by vacuum evaporation, and the insulator materials may be grown by chemical vapor deposition and/or molecular beam epitaxy. CdHgTe is also the preferred material used in the processor system since it is closely latticed and thermal expansion coefficient matched over the entire range of compositions. The monolithic IR focal plane CCD imager however is not restricted to the CdHgTe material system. Any lattice and thermal expansion matched system with the appropriate set of properties can be used.

It is clear that the focal plane device 8 is spectrally versatile since only one set of technologies is required to fabricate all the layers and the CCD and its accessories with the sole exception that the composition of the absorber layer 16 may be changed to make the device operable over a specific range of wavelengths. The device of this invention can be made to operate in the 1-2 micron, the 3-5 micron, and 8-14 micron atmosphere windows by simply changing the composition of the absorber $Cd_yHg_{1-y}Te$ layer. The rest of the device layers and structures can remain the same. Hence, device simplicity, versatility, and reliability are key advantages in the present focal plane device. Also, the whole fabrication technique is quite compatible with large scale integration which can potentially impact its cost.

OPERATION OF MONOLITHIC FOCAL PLANE

Figure 2A:
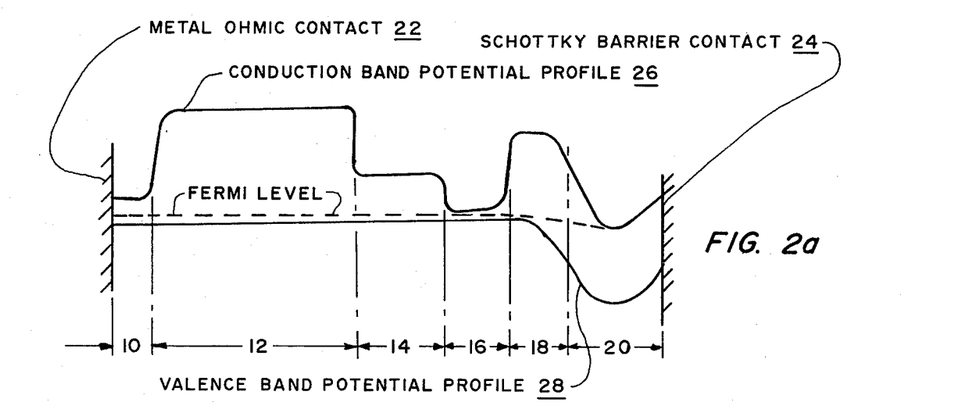
FIG. 2A shows the energy band diagram of the focal plane under equilibrium conditions with no bias applied.
Figure 2B:
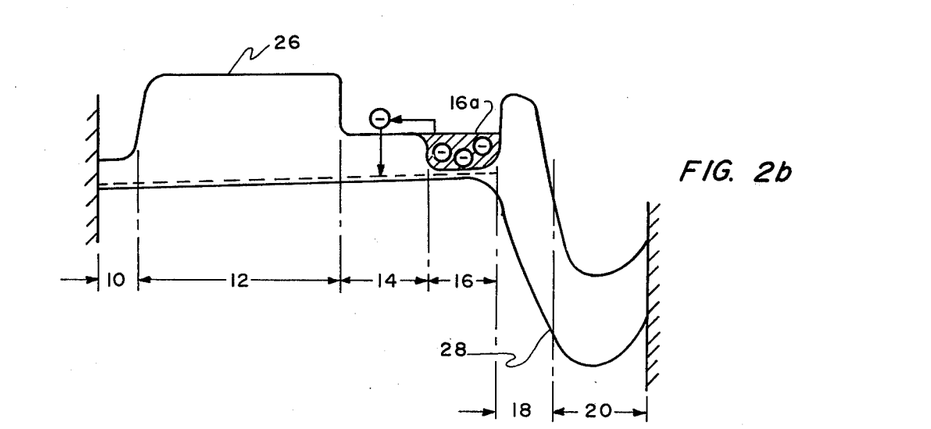
FIG. 2B shows the energy band diagram under operational conditions for the CCD with no charge in the channel layer.

Operation of the focal plane imager device 8 is explained herein below with reference to the Figures as appropriate. First, the imager has a video output from the CCD shift register 40 as shown by FIG. 5 that is a video signal in the general raster sense and may be used in a direct view system, such as application to LED array, or may be used in a remote view system, such as application to a transmitter for generating television type signals. The incoming signal to the focal plane is in the IR spectrum. The incoming IR signal along with background radiation enter through optical filter 10, which defines the short wavelength cutoff for the imager device 8, passes through the p-type window substrate 12 and the spillover layer 14 with the IR signal and background radiation being absorbed and converted to electron charges in the absorber layer 16. The equilibrium energy band diagram including the conduction band potential profile 26 and the valence band potential profile are shown schematically in FIGS. 2A, 2B and 2C. The biased condition when there is no charge in the CCD channel layer 20 is shown in FIG. 2B. The bias condition at this time may be shown in the Schottky barrier gates $\phi 1$, $\phi 2$, $\phi 3$, and $\phi 4$ of FIG. 6. Actually, FIG. 2B may also represent an instant in time wherein charges may be present in the CCD channel but have not been completely swept out by the transfer gate 38. The CCD channel 20 may be thought of in FIGS. 2B and 2C as accepting charges from absorber layer 16 only when the Schottky barrier gates are activated for a length of time corresponding to the intergration time. The gate voltages for processing and transferring charge along the CCD channels to the transfer gate 38 are, say, +15 volts with the inactive +5 volts as indicated by the waveforms pf $\phi 1$, $\phi 2$, $\phi 3$, and $\phi 4$ of FIG. 6. The voltages may however be in the range 10 volts difference between the activated and inactivitely, such as +1 volt to +11 volts or +10 volts to +20 volts respectively between the inactivated and activated gates. The channel stop voltage is shown representative as approximately −5 volts.

Figure 2C:
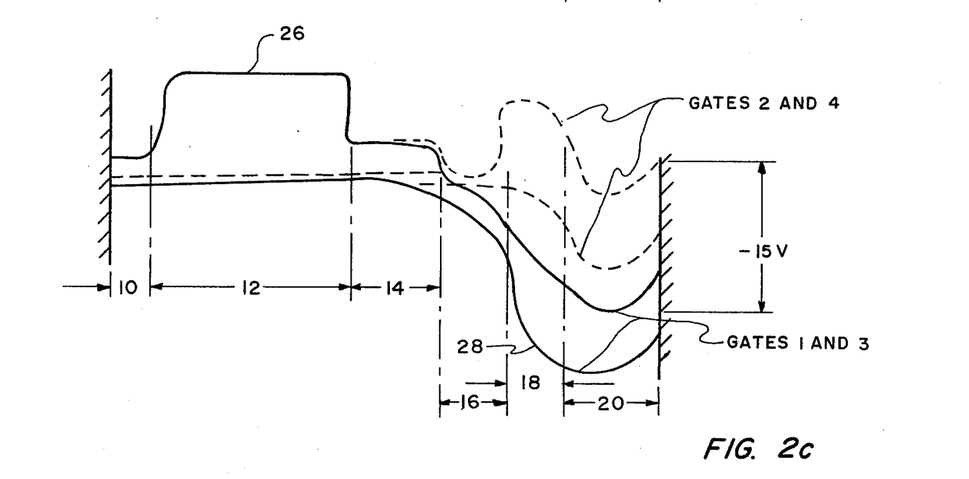
FIG. 2C shows the energy band diagram under "punched through" injection conditions of the charge into the channel layer.

During the processing of the charge signal in the CCD channel 20, the CCD channel well is prevented from being filled by the potential barrier formed between the p-type absorber layer 16, which is the low bandgap sensor, and the p-type transfer layer 18. If the P-P heterobarrier between the absorber and transfer layers of this invention were not present, the thermally and optically generated signal carriers could become excessive and would flow into the CCD channel 20 and fill the CCD well. For example, under low contrast conditions of high background radiation and small signal as is the case of the 8–14 micron region, the CCD channel would quickly fill and the imager would be inoperable. With the present P-P heterobarrier however the photon generated charge is allowed to enter the channel layer 20 only when the heterobarrier is "punched through" as shown by the solid line, indicated by lead lines as gates 1 and 3, on the energy band diagram of FIG. 2C. The "punched through" condition may be achieved by momentarily lowering the substrate voltage to about −15 volts from substrate voltage source 13 that is electrically connected to the metal ohmic contact 22. The channel stop voltage source 45 applies a negative voltage as required to maintain isolation at the instant that the substrate voltage is −15 volts. When the signal charges that are injected in to the CCD channel 20 are transferred to the end of the array by the four phase clock voltage, as shown in FIG. 6, the charge signals are swept out of gates 1 and 4, as shown by FIG. 5, into the CCD shift register 40 by activating transfer gate 38. During the time that the charges are being processed in the CCD channel, the voltage biasing is set such that the absorber layer is isolated from the channel layer by the P-P heterobarrier. The isolated condition is shown by dashed lines in FIG. 2C. The "punched through" injection condition shown by the solid line in the condition band potential profile 26 is as indicated by FIG. 2C.

The preferred sequence of operations of the substrate and channel stop voltages, the phased voltages $\phi1$, $\phi2$, $\phi3$, and $\phi4$, the transfer gate 33 punch down voltages, and the CCD shift register 40 read out voltages are as follows. First, a photon charge wave $h_\nu$ is constantly received into the absorber layer 16 and the electron charges produced therein must be systematically controlled and selectively switched out of the focal plane imager as a video output signal. The photon charge wave, comprised of the usable signal and background radiation, enters through an optical filter 10, passes through the p-type window substrate 12 and through the spillover layer 14 into the absorber layer 16. The photon charge wave $h_\nu$ is absorbed in the absorber layer 16 and is converted to electrons, or electron charges. Since the absorber layer has the lowest bandgap, the electron charges remain therein except for possibly some spillover in the spillover layer 14. The spillover layer 14 readily handles the extra electrons since the spillover layer has a large charge handling capability due to its higher bandgap and much wider thickness. Recombination of some of these electrons occur during the off time, or non-read period, even more so than during the read period. The P-P heterobarrier, between the absorber layer 16 and the transfer layer 18 does not allow the electron charges to enter the channel layer 20. This P-P heterojunction therefore prevents the premature "CCD well" filling of channel layer 20 and allows for signal time sampling.

The electron charges produced within the absorber layer 16 during the read time are injected into the channel layer 20 by the "punch through" condition maintained by the voltage on the substrate layer 12 being lowered from about 0 volts to −15 volts. Refer to what happens between the condition of FIGS. 2B and 2C. FIG. 2B is the condition of electron charges 16A filling the absorber layer 16 while the absorber layer is isolated from the CCD well channel layer 20, with the channel layer 20 at that instant having the previous electron charges that were just punched through the P-P heterojunction being transferred along the CCD channel and subsequently parallel read out by transfer gate 38. FIG. 2C shows the condition where the previous punched through electron charges have been read out and the present electron charges, shown as 16A in FIG. 2B, are now instantly punched through into the CCD well channel layer 20. By considering alternating switching of odd gates 1 and 3 simultaneously and even gates 2 and 4 simultaneously, it can further be seen by FIG. 1 that the activated gate is surrounded on all four sides by inactivated gates which in the present device provides better optical resolution. Looking now at the lower part of FIG. 6, it can be seen how the Schottky barrier gates sweep the charges out on a line by line basis.

The amount of time that the substrate voltage is lowered to −15 volts, or the time the P-P heterojunction is punched down corresponds to the injection time, i.e. the integration time, of the focal plane imager. This time is selected such that the CCD well is never completely filled. Normal TV frametime which may be used is 33 milliseconds. Calculations show that the integration time for use of the absorber layer 16 composition for the 8–14 micron range is about 20 microseconds, and for absorber layer 16 composition for the 3–5 micron range is about 2 milliseconds. When the absorber layer 16 composition is for the 1–2 micron range, the integration time is set at approximately the frame time. A restriction on time sampling and processing is shown in FIG. 7, i.e. after the transfer gate 38 stays punched down for the transfer gate pulses from Schottky barrier gates phases $\phi1$ and $\phi4$ there is a time interval during which the CCD shift register 40 must read-out the last charge before the transfer gate accepts the next gate phases $\phi1$ and $\phi4$. Referring to FIG. 7 again, it should be stated here that after simultaneous punch down of Schottky barrier gates 1 and 3 by applying −15 volts to the substrate and subsequent return to 0 volts the signal charge thus injected into the channel is read out through gates 1 with dimensions 1L and 1T and gates 4 with dimensions 4L and 4T into the CCD shift register 40 via the transfer gate 38. The next frame is read out in like manner after simultaneous punch down of gates 2 and 4 for signal charge injection, again through gates 1 and 4, FIG. 5. In other words, the "punch through" of electron charges from the absorber layer 16 to the CCD wells through the P-P heterojunction is by control of the substrate voltage 13, and subsequent read-out, following transfer of the charges into channel 20, depends upon the odd/even gate combinations that interface with the transfer gate, i.e. gates 1 and 4 as shown in FIG. 5. The signal charges are hence repeatedly time sampled and the CCD charge handling capability is not exceeded. The operation can be likened to a sensor-switch-processor configuration wherein the sensor signal is switched into the processor for specific time intervals so that the processor is never overloaded with charge. This method of injection and device concept is a novel feature of this invention. Spatial resolution of the generated charges is maintained by arranging the four gate phases properly as mentioned where an activated gate is surrounded on all four sides by inactivated gates. Because of the novel injection method, the device does not suffer from incompatibility between detector operating point and MOS threshold voltage as it does in more conventional schemes.

It should be noted that Group III-V materials may be used as the present monolithic device since they operate in the 3-5 micron region, but they do not operate in the 8-14 micron region. Thus, the use of the Group III-V materials becomes restrictive. However, any lattice matched material having the proper bandgaps, thicknesses, the doping types and levels may be used in replacement of, or in combination with, the CdHgTe/CdTe materials in the present monolithic IR focal plane CCD imager.

It should also be understood that an alternate means of applying voltage to the substrate to establish the punch through condition for charge injection from the absorber layer to the CCD channel would be the electrical equivalent of charging the gate voltages appropriately. In addition, edge passivation can be implemented by insulating layers and/or Schottky barrier, or MIS field plates. It should be noted that the video output shown in FIG. 5 is raw video data which may need further processing (i.e. background suppression, etc.) for display.

While preferred embodiments and method of producing have been disclosed, it will be apparent to those skilled in the art that variations in specific details which have been described and illustrated may be made without departing from the spirit and scope of the invention as described in the appended claims.

We claim:

1. A method of preparing a monolithic intrinsic IR focal plane array CCD imager having a simple fabrication compatible with LSI technology; the steps of said method comprising:

providing a p-type, low resistivity single crystal wafer window substrate layer having an input side and an output side;

seeding the growth of four layers on said output side by using said p-type, low resistivity single crystal wafer window substrate layer in which said substrate layer furnishes the seed for said four layers, growing a p-doped wide band spillover layer on said window substrate layer, growing a p-doped narrow band absorber layer on said spillover layer, growing a p-doped transfer layer on said absorber layer, said transfer layer forming a heterojunction with said absorber layer and said transfer layer and absorber layer being lattice matched with proper bandgap, thickness and doping types and levels for efficient injection across said heterojunction, and growing an n-doped channel layer on said transfer layer;

forming a CCD gate structure on said channel layer wherein said step of forming a CCD gate structure comprises deposition on said channel layer a plurality of Schottky barrier gates designated 1, 2, 3, and 4 and a plurality of channel stops separating rows of said Schottky barrier gates 1, 2, 3, and 4 and next depositing a first insulator layer between said plurality of channel stops and said Schottky barrier gates and depositing a first metallization forming first and second metal layers over said first insulator layer wherein said second metal layer is connected to Schottky barrier gate 4 and said first metal layers is connected to Schottky barrier gate 3 and depositing a second insulator layer over said first metallization and the remaining bare area of said first insulator layer then depositing a second metallization forming third and fourth metal layers over said second insulator layer wherein said third metal layer is connected to Schottky barrier gate 1 and said fourth metal layer is connected to Schottky barrier gate 2;

depositing a p-doped optical filter over said input side of said substrate layer; and depositing a metal ohmic contact on a portion of said p-doped optical filter.

2. A method as set forth in claim 1 wherein the step of said seeding the growth of four layers is by liquid phase epitaxy at about 300° Centigrade to 500° Centigrade at a growth rate of about ½ micron per minute.

3. A method as set forth in claim 2 wherein in the step of forming a CCD gate structure the depositing of said plurality of Schottky barrier gates 1, 2, 3, and 4 and said plurality of channel stops is aluminum grown by vacuum evaporation and wherein said depositing said first and second insulator layers is depositing SiOx doped with nitrogen grown by chemical vapor deposition and molecular beam epitaxy.

4. A method as set forth in claim 3 wherein said step of providing a p-type, low resistivity single crystal wafer is Cadmium-Telluride that is seeded by the step of seeding the growth of four layers is by p-type Cadmium-Mercury-Telluride for said spillover, absorber and transfer layers and by n-type Cadmium-Mercury-Telluride channel layer wherein the layers are grown to a growth of a p-doped $Cd_xHg_{1-x}Te$, $1\times10^{16}$ cm$^{-3}$, 20 micron thick spillover layer and a p-doped $Cd_yHg_{1-y}Te$, $1\times10^{15}$ cm$^{-3}$, 2 micron thick absorber layer and a p-doped $Cd_zHg_{1-z}Te$, $1\times10^{16}$ cm$^{-3}$, 4 micron thick transfer layer and a n-doped $Cd_zHg_{1-z}Te$, $1\times10^{16}$ cm$^{-3}$, 2 micron thick channel layer.

* * * * *